United States Patent
Sasaki (10) Patent No.: US 8,696,862 B2
(45) Date of Patent: Apr. 15, 2014

(54) SUBSTRATE MOUNTING TABLE, SUBSTRATE PROCESSING APPARATUS AND SUBSTRATE TEMPERATURE CONTROL METHOD

(75) Inventor: Yasuharu Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 670 days.

(21) Appl. No.: 12/366,177

(22) Filed: Feb. 5, 2009

(65) Prior Publication Data

US 2009/0194264 A1 Aug. 6, 2009

Related U.S. Application Data

(60) Provisional application No. 61/048,255, filed on Apr. 28, 2008.

(30) Foreign Application Priority Data

Feb. 6, 2008 (JP) .................................. 2008-026235

(51) Int. Cl.
C23F 1/00 (2006.01)
H01L 21/306 (2006.01)
C23C 16/00 (2006.01)

(52) U.S. Cl.
USPC ............. 156/345.53; 156/345.44; 118/723 R; 118/724; 118/728

(58) Field of Classification Search
USPC ............. 156/345.51, 345.53, 345.43–345.44; 118/724, 715, 722, 723 R, 723 E
See application file for complete search history.

(56) References Cited

U.S. PATENT DOCUMENTS

| | | | | |
|---|---|---|---|---|
| 5,609,720 A | * | 3/1997 | Lenz et al. | 438/715 |
| 5,738,165 A | * | 4/1998 | Imai | 165/80.2 |
| 6,028,762 A | * | 2/2000 | Kamitani | 361/234 |
| 6,048,434 A | * | 4/2000 | Tamura et al. | 156/345.52 |
| 6,740,853 B1 | * | 5/2004 | Johnson et al. | 219/444.1 |
| 7,156,951 B1 | * | 1/2007 | Gao et al. | 156/345.53 |
| 2005/0211385 A1 | | 9/2005 | Benjamin et al. | |
| 2007/0089834 A1 | * | 4/2007 | Brillhart et al. | 156/345.27 |
| 2007/0258186 A1 | | 11/2007 | Matyushkin et al. | |

FOREIGN PATENT DOCUMENTS

| | | |
|---|---|---|
| CN | 101111934 A | 1/2008 |
| JP | 5-13350 A | 1/1993 |
| JP | 5-67551 | 3/1993 |
| JP | 2000-317761 | 11/2000 |
| JP | 2001-274228 | 10/2001 |
| JP | 2003-133401 A | 5/2003 |
| JP | 2005-79415 | 3/2005 |

OTHER PUBLICATIONS

Korean Office Action issued Feb. 18, 2011, in Patent Application No. 10-2009-0009726 (with English-language translation).

* cited by examiner

*Primary Examiner* — Maureen Gramaglia
(74) *Attorney, Agent, or Firm* — Rothwell, Figg, Ernst & Manbeck, P.C.

(57) ABSTRACT

A substrate mounting table is disposed in a processing chamber for performing a plasma process on a substrate and includes at least one power feed part formed of an insulating material surrounding a power feed line and a cooling medium path. The substrate mounting table further includes a protrusion portion for dividing a space formed on a substrate mounting surface of the mounting table into regions, inlet ports through which cooling gases are introduced into the regions divided by the protrusion portion, and a controller for controlling pressures or flow rates of the cooling gases.

14 Claims, 7 Drawing Sheets

SUBSTRATE MOUNTING TABLE, SUBSTRATE PROCESSING APPARATUS AND SUBSTRATE TEMPERATURE CONTROL METHOD

FIELD OF THE INVENTION

The present invention relates to a mounting table for mounting a substrate such as a semiconductor wafer thereon, the mounting table having an electrostatic chuck; and more particularly, to a substrate mounting table capable of solving a problem of nonuniformity in a substrate temperature due to characteristics of heat transfer around a power feed line in the electrostatic chuck, a substrate processing apparatus having the mounting table and a temperature control method of a substrate to be processed.

BACKGROUND OF THE INVENTION

In a processing apparatus of a substrate such as a semiconductor wafer, an electrostatic chuck is widely used to support and hold the substrate. The electrostatic chuck is formed of a dielectric on a surface of a mounting table of the substrate and a metal electrode plate is buried right under the dielectric. A high voltage DC power is applied to the electrode plate to adsorptively hold the substrate by a Coulomb force or a Johnson-Rahbek force.

Further, in a plasma processing apparatus, since a wafer serving as a substrate to be processed receives heat from above, the mounting table of the substrate is formed of a material such as metal having a high thermal conductivity and a coolant path is provided inside the mounting table to cool the mounting table. Further, a heat transfer gas such as He gas is introduced into a gap between the mounting table and a backside of the wafer to facilitate cooling of the wafer.

A power feed line is connected to the electrode plate of the electrostatic chuck to supply a voltage applied from a power supply to the electrode plate. The power feed line may be provided at a central portion of the mounting table as disclosed in, e.g., Japanese Patent Laid-open Publication No. 2000-317761, and may be provided at a peripheral portion of the mounting table as disclosed in, e.g., Japanese Patent Laid-open Publication No. 2001-274228.

Since a voltage applied to the electrode plate of the electrostatic chuck is a high voltage, the power feed line needs to be surrounded by an insulating material. Generally, since the insulating material has a low thermal conductivity, the insulating material surrounding the power feed line is different from a portion made of a material having a high thermal conductivity in the heat transfer amount from the substrate to the mounting table. That is, in the vicinity of the power feed line, an amount of heat transferred to the coolant is small and a surface temperature of the substrate increases. Accordingly, since an amount of heat dissipated from the substrate to the mounting table becomes small in the vicinity of the power feed line, the substrate temperature in this portion becomes higher than that in the other portion. Therefore, for example, in a plasma etching process, an undesirable difference in characteristics of the etching process may occur between a portion in the vicinity of the power feed line and the other portion.

SUMMARY OF THE INVENTION

In view of the above, the present invention provides a substrate mounting table, which adsorptively holds a substrate to be processed by using an electrostatic chuck in a depressurized chamber for performing a plasma process on the substrate, the substrate mounting table capable of substantially uniformly maintaining a temperature of the entire substrate by controlling an amount of heat dissipated from the substrate at a desired value in a portion in the vicinity of a power feed line and the other portion, and a temperature control method.

In accordance with a first aspect of the present invention, there is provided a substrate mounting table, which is disposed in a processing chamber for performing a plasma process on a substrate and includes at least one power feed part formed of an insulating material surrounding a power feed line and a cooling medium path, the substrate mounting table comprising: a protrusion portion for dividing a space formed on a substrate mounting surface of the mounting table into regions; inlet ports through which cooling gases are introduced into the regions divided by the protrusion portion; and a controller for controlling pressures or flow rates of the cooling gases.

In the substrate mounting table, gas channels including inlet ports and discharge ports of the cooling gases may be respectively formed in the regions divided by the protrusion portion.

Further, in the substrate mounting table, the regions may have a smaller area as they get closer to a center of the power feed line.

The power feed part may be provided at a central portion of the substrate mounting table. In this case, the protrusion portion may be formed to have a specific radius around the power feed part.

Further, in this case, protrusion portion may be formed concentrically with the power feed part while a center of the power feed part is arranged on its central axis.

The power feed part may be provided at a periphery of the substrate mounting table. In this case, the protrusion portion may be formed to have a specific radius around the power feed part. Further, the protrusion portion may be formed concentrically with the power feed part while a center of the power feed part is arranged on its central axis.

In accordance with a second aspect of the present invention, there is provided a substrate temperature control method for controlling a temperature of a target substrate mounted on a substrate mounting table, which is disposed in a processing chamber for performing a plasma process on the substrate and includes a power feed part formed of an insulating material surrounding a power feed line and a cooling medium path, the method comprising: forming a protrusion portion for dividing a space formed on a substrate mounting surface of the mounting table into regions; introducing cooling gases into the regions divided by the protrusion portion, respectively; and controlling the temperature of the substrate by controlling pressures or flow rates of the cooling gases supplied to the regions.

In the temperature control method, the temperature of the substrate may be controlled by forming the regions to have a smaller area as they go inward.

Further, the temperature of the substrate may be controlled by forming the protrusion portion to have a specific radius around the power feed part concentrically with the power feed part.

In accordance with a third aspect of the present invention, there is provided a substrate processing apparatus comprising the substrate mounting table.

In accordance with the aspects of the present invention, it is possible to eliminate variation in the heat transfer in the vicinity of the power feed line of the electrostatic chuck disposed on the mounting table and to uniformly maintain the temperature of the substrate mounted on the mounting table, thereby improving quality of the substrate.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Figure 1:
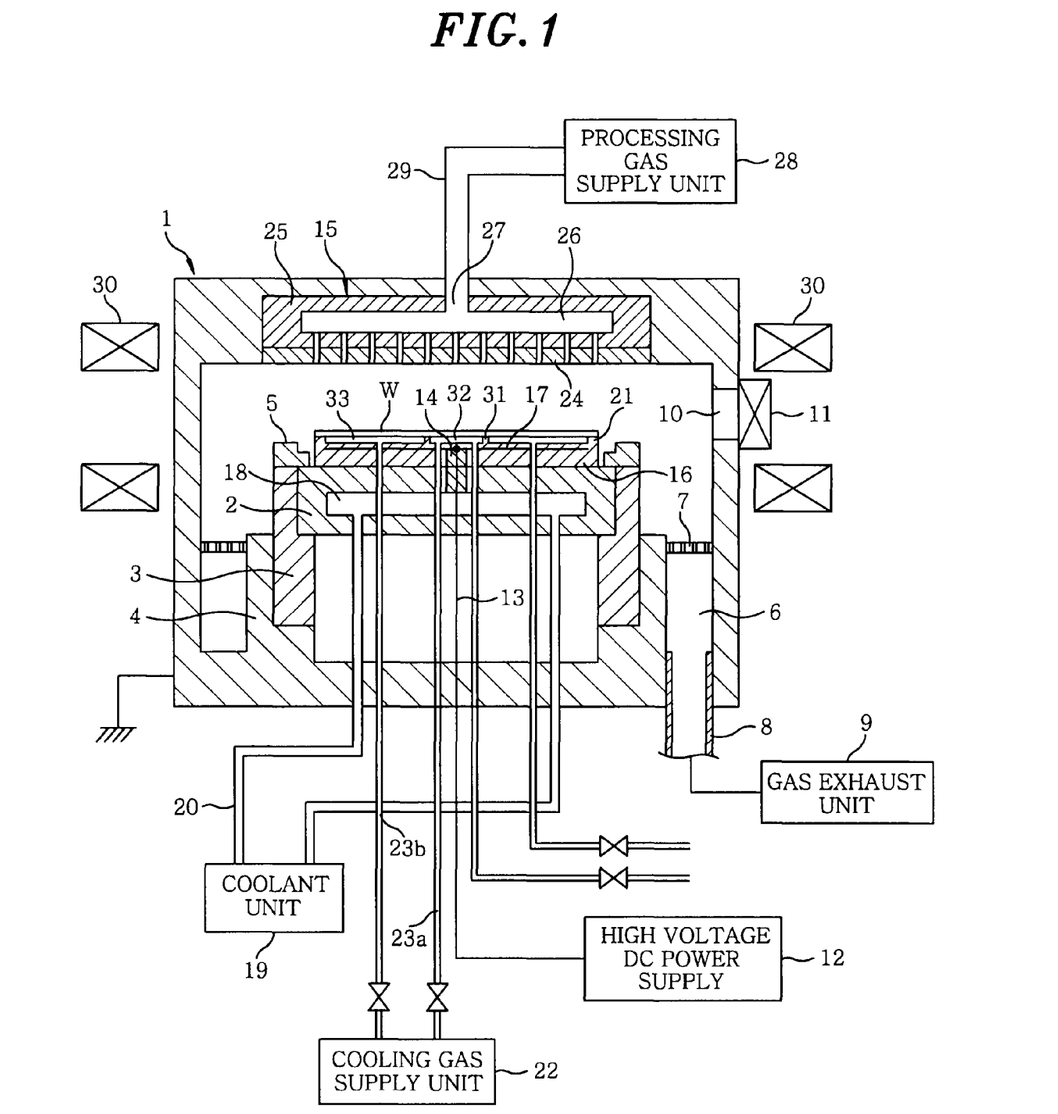
FIG. 1 schematically shows a configuration of a plasma processing apparatus (plasma etching apparatus) in accordance with an embodiment of the present invention.

Hereinafter, embodiments of the present invention will be described in detail with reference to the accompanying drawings which form a part hereof. FIG. 1 schematically shows a configuration of a plasma processing apparatus (plasma etching apparatus) in accordance with an embodiment of the present invention. In FIG. 1, a cylindrical chamber 1 is made of, e.g., aluminum or stainless steel and is airtightly sealed. Further, the chamber 1 is grounded.

A mounting table (susceptor) 2 for mounting a substrate to be processed (e.g., a semiconductor wafer) W thereon is provided inside the chamber 1. The susceptor 2 shown in FIG. 1 exchanges heat with the semiconductor wafer W in contact with the susceptor 2 to adjust a temperature of the semiconductor wafer W, thereby functioning as a heat exchange plate. The susceptor 2 is made of a material such as aluminum having an excellent conductivity and thermal conductivity and also serves as a lower electrode.

The susceptor 2 is supported by an insulating cylindrical maintaining portion 3 made of ceramics or the like. The cylindrical maintaining portion 3 is supported by a cylindrical supporting portion 4 of the chamber 1. A focus ring 5 made of quartz is disposed on an upper surface of the cylindrical maintaining portion 3 to annularly surround an upper surface of the susceptor 2.

An annular gas exhaust passageway 6 is formed between a sidewall of the chamber 1 and the cylindrical supporting portion 4. An annular baffle plate 7 is provided in the entrance or in the middle of the gas exhaust passageway 6. A bottom portion of the gas exhaust passageway 6 is connected to a gas exhaust unit 9 through a gas exhaust pipe 8. The gas exhaust unit 9 has a vacuum pump and depressurizes the chamber 1 to a predetermined vacuum level. A gate valve 11 is attached to a sidewall of the chamber 1 to open and close a loading/unloading port 10 of the semiconductor wafer W.

The susceptor 2 is electrically connected to a high frequency power supply for generation of a plasma through a matching unit and a power feed rod (both are not shown) The high frequency power supply supplies a high frequency power having a frequency of, e.g., 40 MHz to the susceptor 2 serving as a lower electrode. A shower head 15 serving as an upper electrode is disposed at a ceiling portion of the chamber 1. A plasma is generated between the susceptor 2 and the shower head 15 by a high frequency power supplied from the high frequency power supply.

Further, the susceptor 2 is connected to a high frequency bias power supply for attracting ions from the plasma to the semiconductor wafer W through a matching unit and a power feed rod (both are not shown). The high frequency bias power supply supplies a high frequency power having a slightly low frequency of, e.g., 12.88 MHz or 3.2 MHz to the susceptor 2.

An electrostatic chuck 16 made of a dielectric material such as ceramics is disposed to maintain the semiconductor wafer W on the upper surface of the susceptor 2 by an electrostatic adsorptive force. An inner electrode 17 is embedded in the electrostatic chuck 16, and is formed of a conductor, e.g., a conductive film of copper, tungsten or the like. The inner electrode 17 is electrically connected to a high voltage DC power supply 12 for supplying a high voltage (e.g. 2500 V or 3000 V) through a power feed line 13. When the high voltage DC power is applied to the inner electrode 17 from the high voltage DC power supply 12, the semiconductor wafer W is adsorptively held on the electrostatic chuck 16 by a Coulomb force or a Johnson-Rahbek force.

A coolant path 18 is provided in the susceptor 2. For example, cold water is supplied to be circulated through the coolant path 18 from a coolant unit 19 through a line 20.

A peripheral annular protrusion portion 21 is provided at a periphery of the electrostatic chuck 16. A gap is formed between a surface of the electrostatic chuck 16 and a backside of the semiconductor wafer W. The gap is divided into an inner region 32 and an outer region 33 by an inner annular protrusion portion 31 formed adjacent to the power feed line 13 to have a specific radius. Cooling gases such as helium are supplied from a cooling gas supply unit 22 to the inner region 32 and the outer region 33 through a gas supply line 23a and a gas supply line 23b, respectively. It is possible to control thermal conductivity between the electrostatic chuck 16 (i.e., the susceptor 2) and the semiconductor wafer W at a certain level by varying a pressure of the cooling gas. This is a feature of the present invention to be described in detail later.

The shower head 15 includes an electrode plate 24 having a number of gas ventilation holes on its bottom surface and an electrode supporting member 25 for detachably supporting the electrode plate 24. A buffer chamber 26 is provided inside the electrode supporting member 25. A gas inlet port 27 of the buffer chamber 26 is connected to a gas inlet pipe 29 extending from a processing gas supply unit 28.

The shower head 15 and the susceptor 2 are installed in parallel to face each other and serve as a pair of electrodes, that is, an upper electrode and a lower electrode. A high frequency electric field is formed in a vertical direction by a high frequency power in a space between the shower head 15 and the susceptor 2 on which the semiconductor wafer W is mounted. A high density plasma is generated in the vicinity of the surface of the semiconductor wafer W by high frequency discharge. Further, an annular ring magnet 30 is arranged around the chamber 1 concentrically with the chamber 1 to form a magnetic field in a processing space between the shower head 15 and the susceptor 2.

Figure 2A:
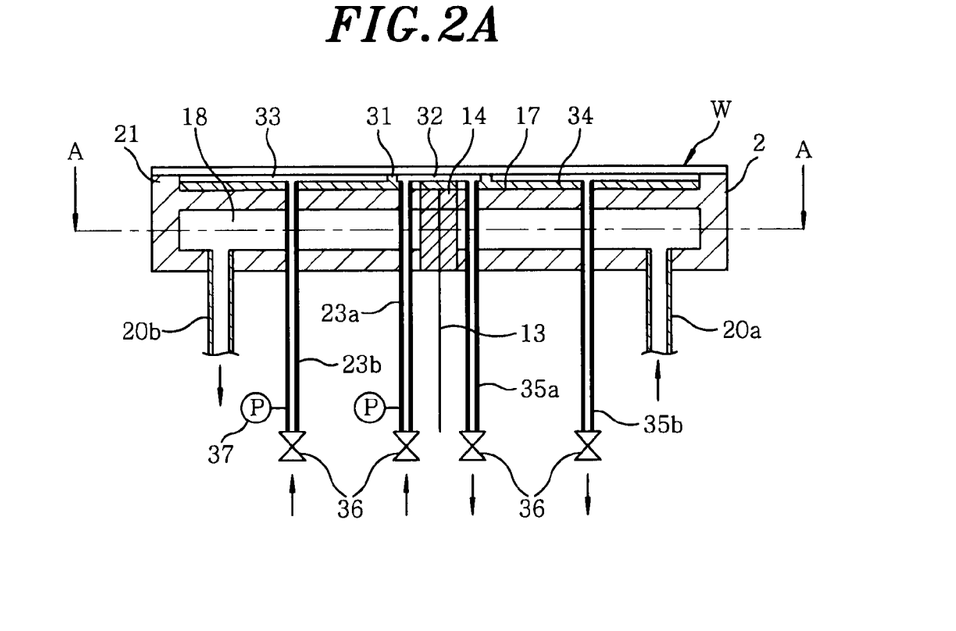
FIGS. 2A and 2B illustrate a structure of an upper portion of a susceptor in accordance with the embodiment of the present invention.
Figure 2B:
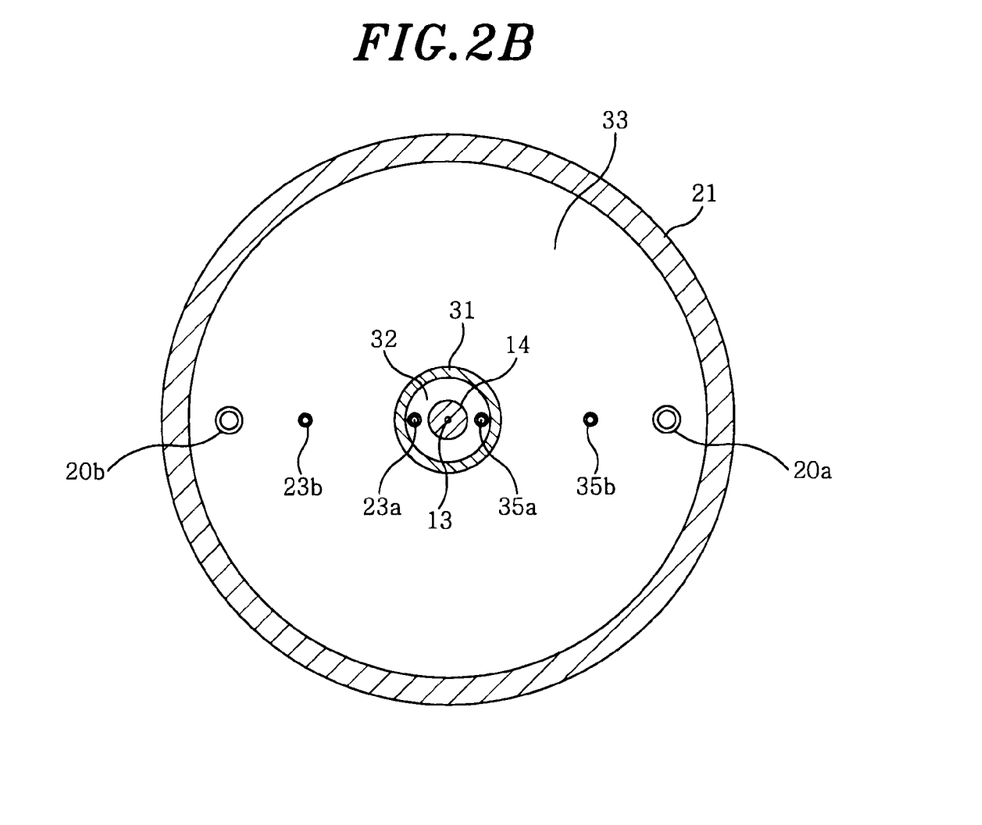

FIGS. 2A and 2B illustrate a structure of an upper portion of the susceptor in accordance with the embodiment of the present invention. FIG. 2A is a cross sectional view and FIG. 2B is a plan view taken along a line A-A shown in FIG. 2A. A dielectric layer 34 is formed at an upper portion of the susceptor 2, and the inner electrode 17 formed of a conductive film is buried right under the dielectric layer 34. A high voltage DC power is applied to the inner electrode 17 via the power feed line 13. A cylindrical insulating member 14 is arranged around the power feed line 13 to prevent electric leakage. The susceptor 2 is made of a material, e.g., metal, having a high thermal conductivity. The coolant path 18 is provided inside the susceptor 2. A coolant is supplied to the coolant path 18 through a line 20a and is discharged through a line 20b, so that the coolant is circulated.

The peripheral annular protrusion portion 21 is provided entirely at an upper outer periphery of the susceptor 2. The substrate W is mounted on the peripheral annular protrusion portion 21. Accordingly, a narrow space is formed between the substrate W and the dielectric layer 34. Further, the inner annular protrusion portion 31 is provided to surround the insulating member 14. The space is divided into the inner region 32 and the outer region 33.

A cooling gas is supplied to the inner region 32 through the gas supply line 23a and is discharged through a gas discharge line 35a. A cooling gas is supplied to the outer region 33 through the gas supply line 23b and is discharged through a gas discharge line 35b. The gas supply lines 23a and 23b and the gas discharge lines 35a and 35b are provided with flow rate control valves 36, respectively. Further, gas supply lines 23a and 23b are provided with pressure gauges 37, respectively. The pressures of the inner region 32 and the outer region 33 can be controlled to be maintained at desired values by adjusting the flow rate control valves 36, respectively.

Further, although the supply lines and the discharge lines of the cooling gases are provided in this embodiment, the discharge lines may be omitted. In a case without the discharge lines, the cooling gas may leak into the chamber by controlling a sealing method (adhesiveness) between the peripheral annular protrusion portion 21 or the inner annular protrusion portion 31 and the substrate W, thereby forming a gas flow.

In the present invention, the gap between the susceptor 2 and the substrate W is divided into the inner region 32 and the outer region 33 such that a cooling gas is independently supplied to each of the inner region 32 and the outer region 33. Accordingly, the temperature of the entire substrate can be uniformly maintained by controlling an amount of heat dissipated from the substrate W. Since the cylindrical insulating member 14 surrounding the power feed line 13 has a low thermal conductivity, it is difficult to transfer heat to the coolant therethrough. Consequently, a surface temperature of the susceptor 2 in the inner region 32 becomes higher than that in the outer region 33, and an amount of heat dissipated from the substrate W to the susceptor 2 in the inner region 32 becomes smaller than that in the outer region 33. Therefore, the key point of the present invention is to accelerate heat transfer through the cooling gas in the inner region 32 by independently controlling the pressure of the cooling gas supplied to each of the inner region 32 and the outer region 33 of the gap between the surface of the susceptor 2 and the substrate W.

That is, in the plasma processing apparatus, since a characteristic length of the space is short in comparison with a maintaining pressure of the space, the cooling gas introduced into the apparatus belongs to a molecular flow regime. In the molecular flow regime, since the thermal conductivity of gas is in proportion to its pressure, it is possible to accelerate heat transfer from the substrate W to the susceptor 2 by increasing the pressure of the inner region 32 to be higher than that of the outer region 33, thereby uniformly maintaining the entire temperature of the substrate W. A detailed description of the grounds for this will be given later.

Figure 3A:
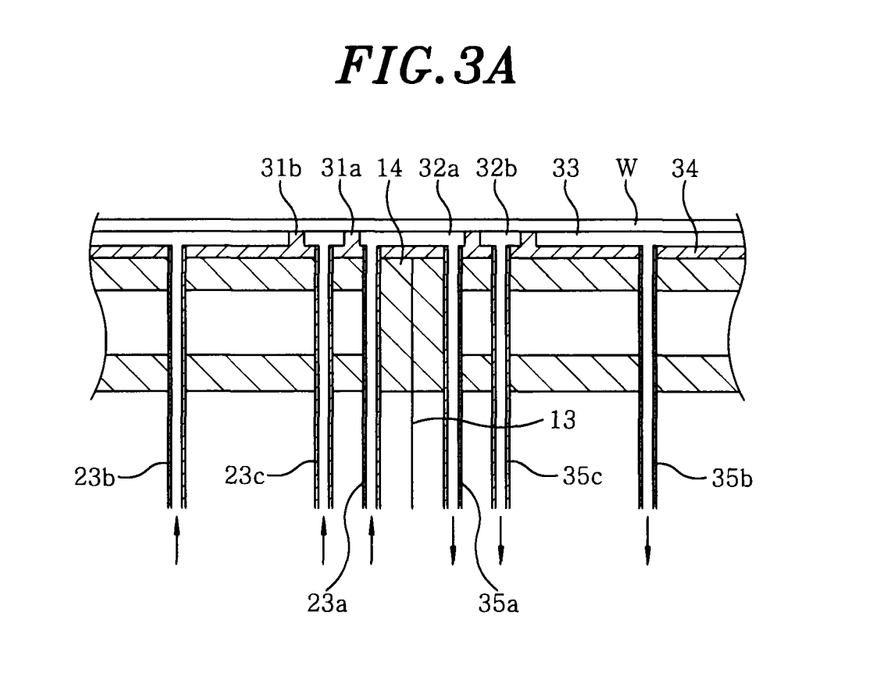
FIGS. 3A and 3B illustrate a structure of an upper portion of a susceptor in accordance with a second embodiment of the present invention.
Figure 3B:
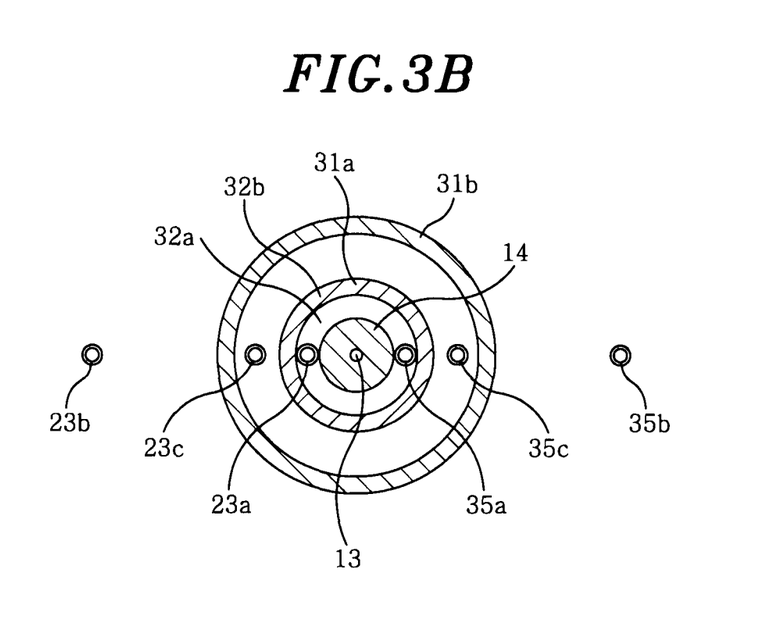

FIGS. 3A and 3B illustrate a structure of an upper portion of a susceptor in accordance with a second embodiment of the present invention and are partially enlarged views showing a central portion thereof. FIG. 3A is a cross sectional view and FIG. 3B is a plan view. In this embodiment, a double inner annular protrusion portion, that is, a first annular protrusion portion 31a of an inner side and a second annular protrusion portion 31b of an outer side, is provided around the insulating member 14 surrounding the power feed line 13. Accordingly, the gap between the susceptor 2 and the substrate W is divided into three regions of a first inner region 32a, a second inner region 32b and an outer region 33. The cooling gas is independently introduced to each region, thereby independently controlling the inner pressure of each region.

That is, the cooling gas is supplied to the first inner region 32a through a gas supply line 23a and is discharged from a gas discharge line 35a. The cooling gas is supplied to the second inner region 32b through a gas supply line 23c and is discharged through a gas discharge line 35c. Further, the cooling gas is supplied to the outer region 33 through a gas supply line 23b and is discharged through a gas discharge line 35b. The gas supply lines 23a, 23b and 23c and the gas discharge lines 35a, 35b and 35c are provided with flow rate control valves (not shown), respectively, thereby independently controlling the pressure of each region. A reason for dividing the gap into three regions is to increase accuracy in control of the substrate temperature, and a detailed description thereof will be given later.

Further, in this embodiment, the first annular protrusion portion 31a and the second annular protrusion portion 31b are formed concentrically with respect to the power feed line 13. The center of the concentric circles may not have to coincide with the center of the power feed line 13, and may do if it lies in the vicinity thereof.

Figure 4A:
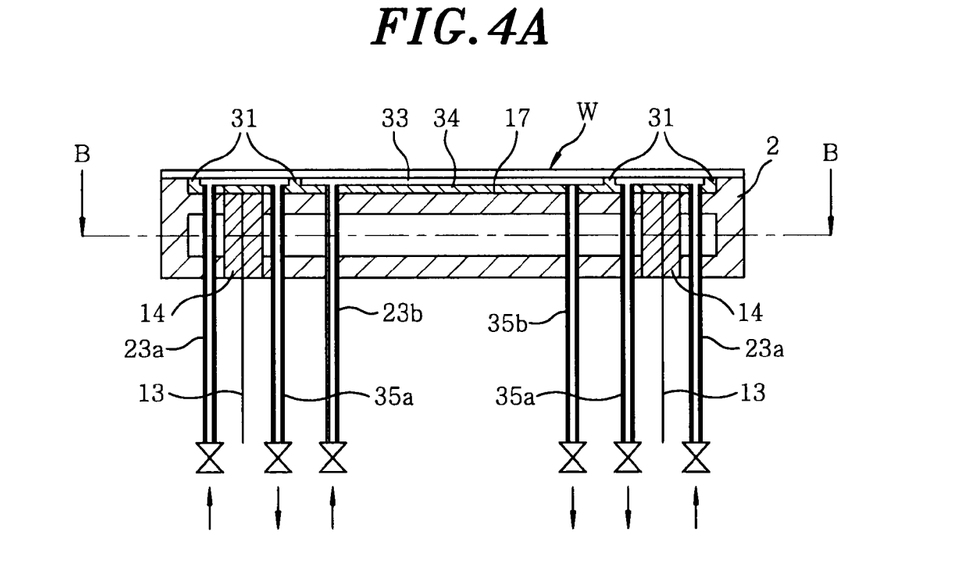
FIGS. 4A and 4B illustrate a structure of an upper portion of a susceptor in accordance with a third embodiment of the present invention.
Figure 4B:
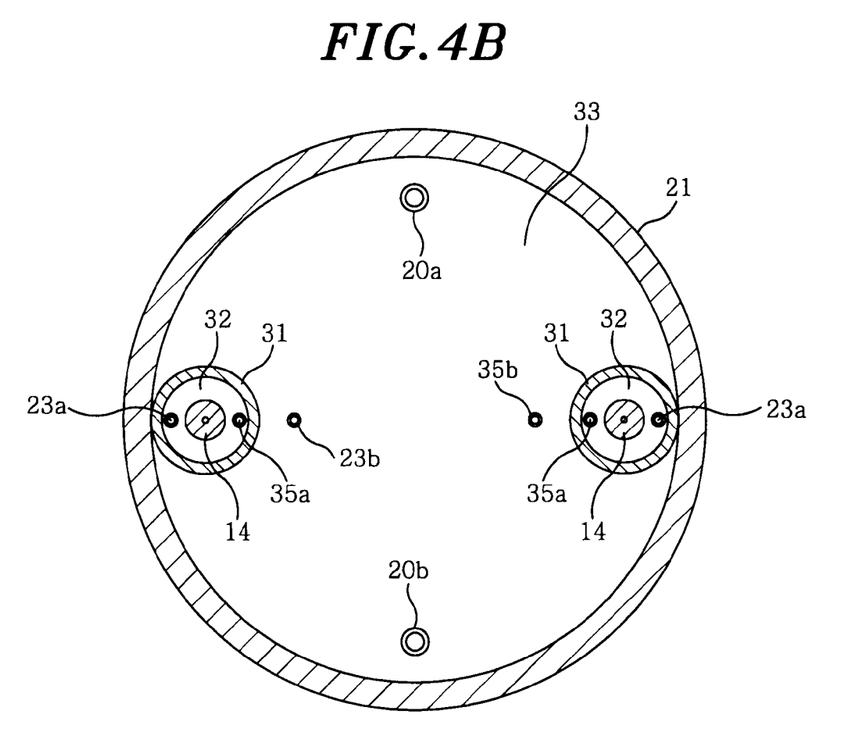

FIGS. 4A and 4B illustrate a structure of an upper portion of the susceptor in accordance with a third embodiment of the present invention. FIG. 4A is a cross sectional view and FIG. 4B is a plan view taken along a line B-B of FIG. 4A. In this embodiment, a pair of power feed lines 13 are positioned to substantially face each other at a periphery of the susceptor 2, instead of being positioned at a center of the susceptor 2. The power feed lines 13 are surrounded by insulating members 14 for insulation in the same way as the case shown in FIG. 2. Accordingly, inner annular protrusion portions 31 are provided around the insulating members 14. The gap between the susceptor 2 and the substrate W is divided into two inner regions 32 and an outer region 33. By employing the above structure, even in a case wherein the power feed lines 13 connected to the inner electrode 17 are provided at a periphery of the susceptor 2, the objects of the present invention can be achieved.

Figure 5:
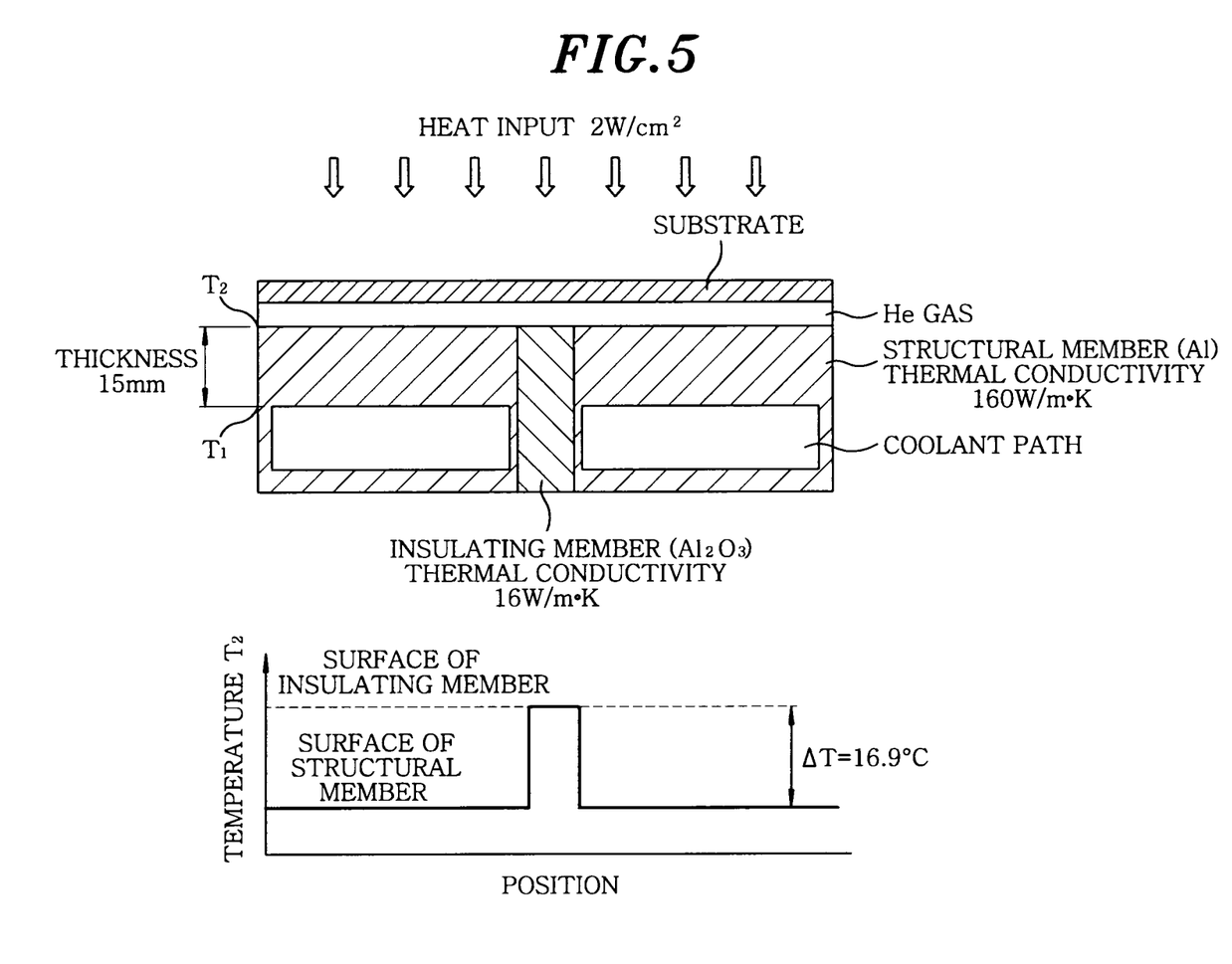
FIG. 5 is a diagram for explaining conditions and results of heat transfer analysis at an upper portion of a susceptor.

Hereinafter, a thermal analysis as the grounds of the present invention will be explained. FIG. 5 is a diagram for explaining conditions and results of a heat transfer analysis at an upper portion of a susceptor. For simple calculation, a one-dimensional heat transfer model, in which heat flowed only in a height direction, was considered. A heat flux density was maintained at a specific value of 2 W/cm² at any position. A coolant temperature, that is, a surface temperature of the coolant path, was indicated by $T_1$ (constant value) and a thickness of a heat transfer layer was 15 mm. Further, an insulating member ($Al_2O_3$) surrounding the power feed line was set to have thermal conductivity of 16 W/m·K, and a structural member (Al) was set to have thermal conductivity of 160 W/m·K.

The surface temperature of the susceptor was calculated under the above conditions and a difference in the surface temperature between the insulating member and the structural member, which was indicated by $\Delta T=T_2$ (insulating member)–$T_2$ (structural member), was determined to be 16.9° C. When there was such a difference in the surface temperature of the susceptor, a temperature difference was generated also in the substrate. Accordingly, it could cause a bad influence on uniformity of the quality of a plasma process.

Figure 6A:
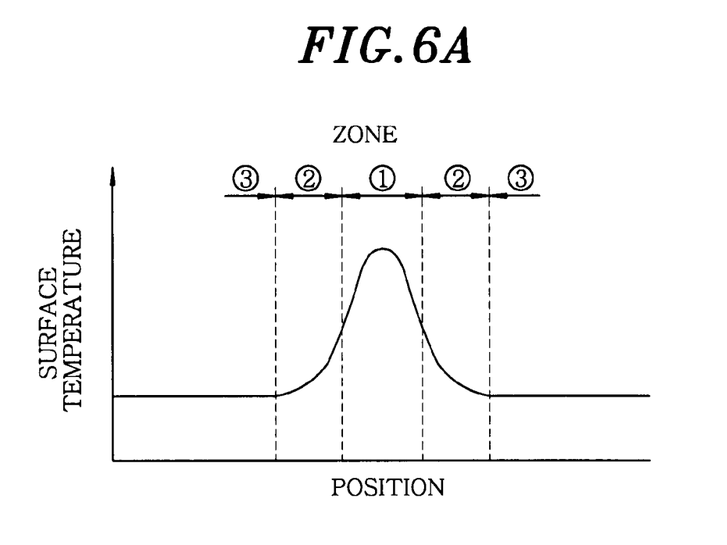
FIGS. 6A and 6B illustrate a concept diagram showing a distribution of actual surface temperatures of the susceptor and a diagram for explaining zone division corresponding to the temperature distribution.
Figure 6B:
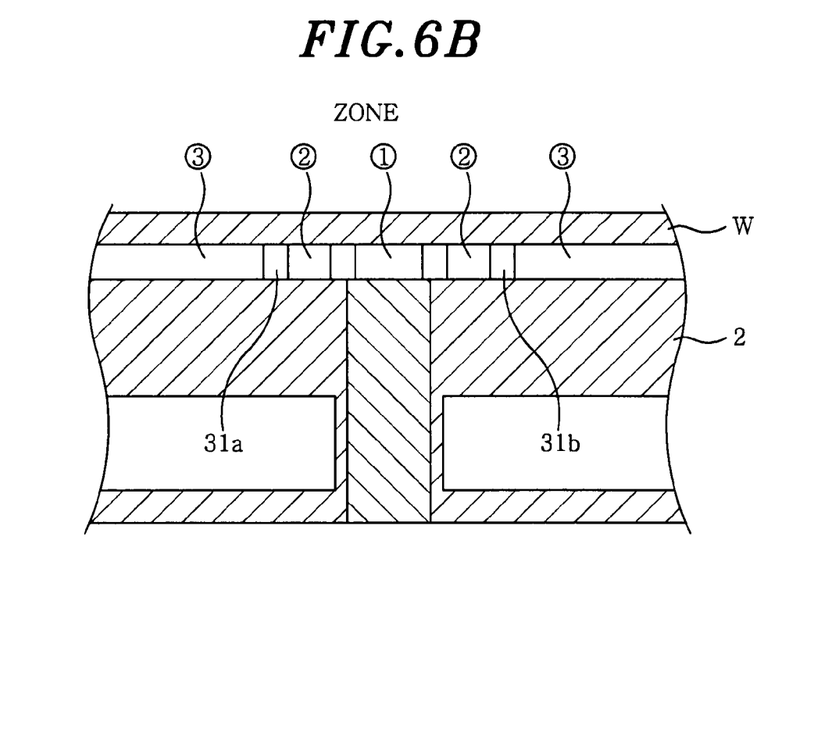

In an actual heat flux, since heat is dissipated also in a horizontal direction without being limited to a one-dimensional direction, a two-dimensional heat transfer model needs to be considered. FIGS. 6A and 6B illustrate a concept diagram showing a distribution of actual surface temperatures of the susceptor and a diagram for explaining zone division corresponding to the temperature distribution. As shown in FIG. 6A, a zone is divided into Zone 1 in which the surface temperature $T_2$ is high in a peak shape, Zone 2 in which $T_2$ gradually decreases with a gentle inclination and Zone 3 in which $T_2$ is maintained at a constant value. Accordingly, as shown in FIG. 6B, preferably, the space between the substrate W and the susceptor 2 is divided into a first inner region (Zone 1), a second inner region (Zone 2) and an outer region (Zone 3) by providing a double partition of the first annular protrusion portion 31a and the second annular protrusion portion 31b such that the pressure P is controlled as indicated by P (Zone 1)>P (Zone 2)>P (Zone 3).

As described above, uniformity of the temperature of the substrate W can be further improved by appropriately controlling the pressures in Zones 1 to 3. The above-described second embodiment is conducted to more precisely control the substrate temperature than in the first embodiment based on the above grounds. The zone may be further divided into four or more zones.

Further, also when the power feed lines 13 are provided at a periphery of the susceptor 2 as in the third embodiment, a double or multiple inner annular protrusion portion 31 may be provided in each of the cylindrical insulating members 14 of the power feed lines 13 to divide each zone into three or more zones, thereby increasing accuracy of control of the substrate temperature.

Figure 7:
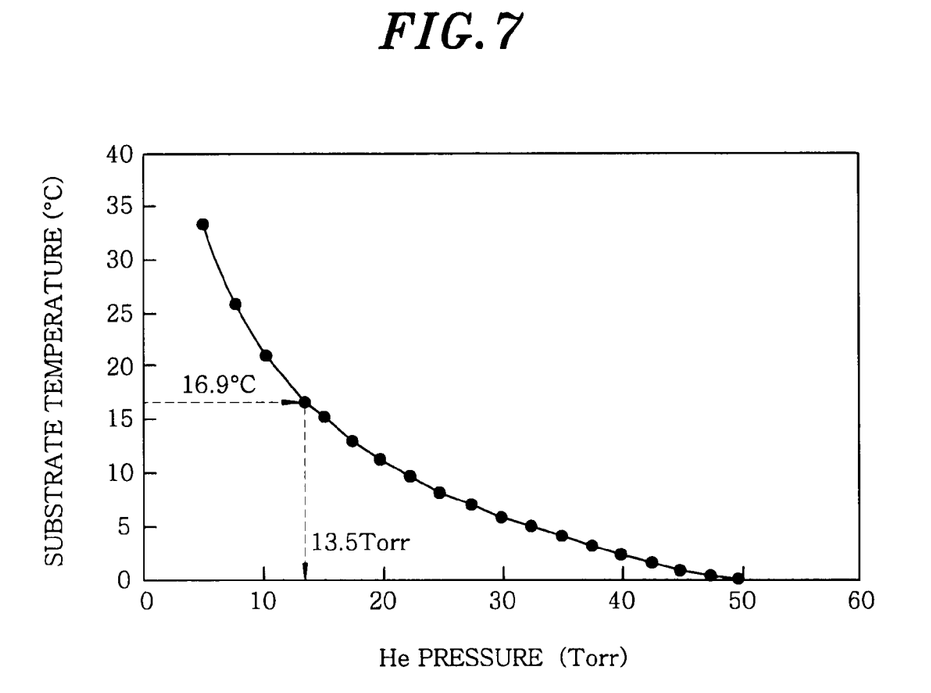
FIG. 7 illustrates a relationship between the pressure of the cooling gas and the substrate temperature obtained through calculation.

Next, an influence of the pressure of cooling gas on the heat transfer will be explained. In a vacuum processing apparatus for performing a plasma process or the like, a cooling gas introduced into a space between the substrate W and the susceptor 2 belongs to a molecular flow regime and the thermal conductivity of the cooling gas is in proportion to its absolute pressure. Accordingly, an amount of heat transferred to the susceptor 2 from the substrate W through the cooling gas increases proportionally to the pressure of the cooling gas. While the heat flux density and the surface temperature of the susceptor were maintained constantly, a relationship between the pressure of the cooling gas (He) and the substrate temperature was obtained through calculation and is shown in FIG. 7. In a case shown in FIG. 7, the substrate temperature was calculated by varying the He pressure under conditions wherein the substrate temperature was set to be 0° C. when the He pressure was 50 Torr.

As shown in FIG. 7, the substrate temperature was set to be 0° C. when the He pressure was 50 Torr, and the substrate temperature increased as the He pressure decreased. The substrate temperature was about 10° C. at a pressure of 20 Torr and about 20° C. at a pressure of 10 Torr. As seen from the above results, when a difference in the surface temperature between the insulating member and the structural member was 16.° C. as in the above case shown in FIG. 5, it is preferable that the He pressure is about 50 Torr at the insulating member (inner region 32) and about 13.5 Torr at the structural member (outer region 33) in order to increase an amount of heat transferred from the substrate W to the susceptor 2. In the method of the present invention, there is no difficulty in controlling the He pressure as described above and it is possible to eliminate a difference in the substrate temperature between a portion in the vicinity of the power feed line and the other portion.

While the invention has been shown and described with respect to the embodiments, it will be understood by those skilled in the art that various changes and modifications may be made without departing from the scope of the invention as defined in the following claims.

What is claimed is:

1. A substrate mounting table, which is disposed in a processing chamber for performing a plasma process on a substrate mounted on the substrate mounting table and includes at least one power feed part formed of an insulating material surrounding a power feed line and a cooling medium path, the substrate mounting table comprising:
   an outer protrusion portion provided at an outer periphery of the substrate mounting table to provide a space between the mounted substrate and a substrate mounting surface of the substrate mounting table;
   an inner protrusion portion provided to surround the insulating material to divide the space into regions, wherein each of the regions is an empty gap;
   inlet ports through which cooling gases are respectively introduced into the regions; and
   a controller that controls pressures or flow rates of the cooling gases,
   wherein the inner protrusion portion is formed concentrically with the power feed part and a center of the power feed part is arranged on a central axis of the inner protrusion portion, and
   wherein the regions have a smaller area as they get closer to the center of the power feed part.

2. The substrate mounting table of claim 1, wherein discharge ports of the cooling gases are respectively formed in the regions.

3. The substrate mounting table of claim 1, wherein the power feed part is provided at a central portion of the substrate mounting table.

4. The substrate mounting table of claim 1, wherein the power feed part is not provided at the center of the substrate mounting table.

5. A substrate processing apparatus comprising the substrate mounting table described in claim 1.

6. The substrate mounting table of claim 1, wherein each inlet port includes a gas supply line including a flow rate control valve, and
   wherein the controller controls each respective flow rate control valve to adjust a pressure in each respective region.

7. A substrate mounting table, which is disposed in a processing chamber for performing a plasma process on a substrate and includes at least one power feed part formed of an insulating material surrounding a power feed line, the substrate mounting table comprising:
   an outer protrusion provided at an outer periphery of the substrate mounting table;
   an inner protrusion provided to surround the insulating material, wherein when mounted, the substrate is supported by the outer and the inner protrusion and an inner region surrounded by the inner protrusion and an outer region surrounded by the inner and the outer protrusion are empty gaps;

inlet ports through which cooling gases are respectively introduced into the regions; and a controller for controlling pressures or flow rates of the cooling gases, wherein the inner protrusion portion is formed concentrically with the power feed part and a center of the power feed part is arranged on a central axis of the inner protrusion portion, and wherein the inner region has a smaller area than the outer region.

8. The substrate mounting table of claim 7, wherein discharge ports of the cooling gases are respectively formed in the inner and outer region.

9. The substrate mounting table of claim 7, wherein the power feed part is provided at a central portion of the substrate mounting table.

10. The substrate mounting table of claim 7, wherein the power feed part is not provided at the center of the substrate mounting table.

11. The substrate mounting table of claim 10, wherein the inner protrusion is formed to have a specific radius around the power feed part.

12. The substrate mounting table of claim 11, wherein the inner protrusion is formed concentrically with the power feed part while a center of the power feed part is arranged on its central axis.

13. A substrate processing apparatus comprising the substrate mounting table described in claim 7.

14. The substrate mounting table of claim 7, wherein each inlet port includes a gas supply line including a flow rate control valve, and wherein the controller controls each respective flow rate control valve to adjust a pressure in each respective region.

* * * * *